United States Patent [19]

Zhang et al.

[11] Patent Number: 5,986,923
[45] Date of Patent: Nov. 16, 1999

[54] METHOD AND APPARATUS FOR IMPROVING READ/WRITE STABILITY OF A SINGLE-PORT SRAM CELL

[75] Inventors: Kevin Zhang, Portland, Oreg.; Donald R. Weiss, Fort Collins, Colo.

[73] Assignee: Hewlett-Packard Company, Palo Alto, Calif.

[21] Appl. No.: 09/073,670

[22] Filed: May 6, 1998

[51] Int. Cl.[6] .................................................. G11C 11/00
[52] U.S. Cl. ...................... 365/154; 365/156; 365/230.05
[58] Field of Search ..................................... 365/154, 156, 365/230.05

[56] References Cited

U.S. PATENT DOCUMENTS

| | | | |
|---|---|---|---|
| 4,764,897 | 8/1988 | Kameyama et al. ..................... | 354/154 |
| 5,764,564 | 4/1998 | Frake et al. .............................. | 365/154 |
| 5,808,933 | 9/1998 | Ross, Jr. et al. ........................ | 365/156 |
| 5,831,896 | 11/1998 | Lattimore et al. ...................... | 365/154 |

*Primary Examiner*—David Nelms
*Assistant Examiner*—Hoai V. Ho

[57] ABSTRACT

A single-ended SRAM cell design reduces SRAM size and provides high storage cell noise margin. A virtual ground line is coupled to the source of the driver NFET of each I/O port inverter of each storage cell in a common bitline column. An isolation mechanism couples the virtual ground line to a low reference voltage during reads and during a write of a "0" to a storage cell, and isolates the virtual ground line from the low reference voltage during a write of a "1" to a storage cell. A clamping device is coupled to the virtual ground line to prevent the potential on the virtual ground line from exceeding the threshold voltage of the isolation mechanism and flipping the stored value in any of the other commonly coupled storage cells when a "1" is being written to another of the commonly coupled storage cells.

8 Claims, 3 Drawing Sheets

METHOD AND APPARATUS FOR IMPROVING READ/WRITE STABILITY OF A SINGLE-PORT SRAM CELL

FIELD OF THE INVENTION

The present invention relates generally to the field of electronic storage devices, and more particularly to a static random access memory.

BACKGROUND OF THE INVENTION

Static random access memory (SRAM) is an essential component in most computer processor based systems. SRAM chips typically include millions of individual cells, each for storing a single digital bit value.

Conventional wisdom has heretofore dictated the use of differential circuit techniques for SRAM cell implementations. Single-ended storage cell designs have not heretofore been able to provide the needed cell stability during read operations while at the same time providing fast enough write capability. The problem arises due to the competing design requirements when reading a logic low value (i.e., a "0") from a storage cell and writing a logic high value (i.e., a "1") to the same cell. Design requirements for ease in reading a "0" from a cell are generally the opposite of design requirements for writing a "1" to the same cell. Differential storage cell designs overcome these design issues by balancing the storage cell inverters and providing dual I/O access to the cell. However, differential storage cell designs require twice as many bitlines and an additional access transistor as compared to single-ended storage cell designs. Accordingly, a need exists for a single-ended storage cell design that provides stability during read operations and speed during write operations.

SUMMARY OF THE INVENTION

The present invention provides a method for eliminating one access transistor per storage cell and one bitline per column. This is accomplished by implementing a single-ended storage cell rather than a differential storage cell. The single-ended implementation provides an isolation mechanism that isolates the low reference voltage of the circuit from a virtual ground line. The virtual ground line is shared by the n-channel field effect transistor (NFET) of each storage cell in the same column that drives its I/O port. During the writing of a "one," the virtual ground line is prevented from bouncing above the ground potential and thereby causing a disturbance in the other memory cells sharing the common bitline so that the noise margin of the SRAM cells are greatly reduced.

A memory cell in accordance with the invention utilizes a five-transistor storage cell design. Four field effect transistors (FETs) are used to implement a bistable flip-flop configuration having one output port that is switchably connected by one access transistor to the common bitline. In the preferred embodiment, the isolation mechanism is implemented with an NFET having a drain coupled to the virtual ground line, its source coupled to the low reference voltage and a gate coupled to a control signal. The control signal turns the NFET on during any read operation or during the write of a "zero" in order to couple the virtual ground line to the low reference voltage. During a write of a "one," the control signal turns the NFET off to isolate the virtual ground line from the low reference voltage. This allows the I/O port from the selected cell to pull up the signal on the I/O port more quickly. However, in order to prevent the signal on the virtual ground line from exceeding the threshold voltage of any of the driving NFETs that share the common bitline, a clamping device is provided to perform this function. In the preferred embodiment, the clamping device is implemented using an NFET with a drain and gate coupled to the virtual ground line and a source coupled to the low reference voltage.

The present invention allows significant saving in the area of the SRAM array for large dense memory application by eliminating one access transistor per storage cell and one column line per column and also offers designers the advantage of being able to adjust the trigger points of the two inverters in each storage cell. In addition, each storage cell can be fine-tuned to provide a high cell noise margin.

BRIEF DESCRIPTION OF THE DRAWING

The invention will be better understood from the following detailed description of the presently preferred exemplary embodiment of the invention taken in conjunction with the accompanying drawing in which like reference numbers indicate identical or functionally equivalent elements.

DETAILED DESCRIPTION

Figure 1:
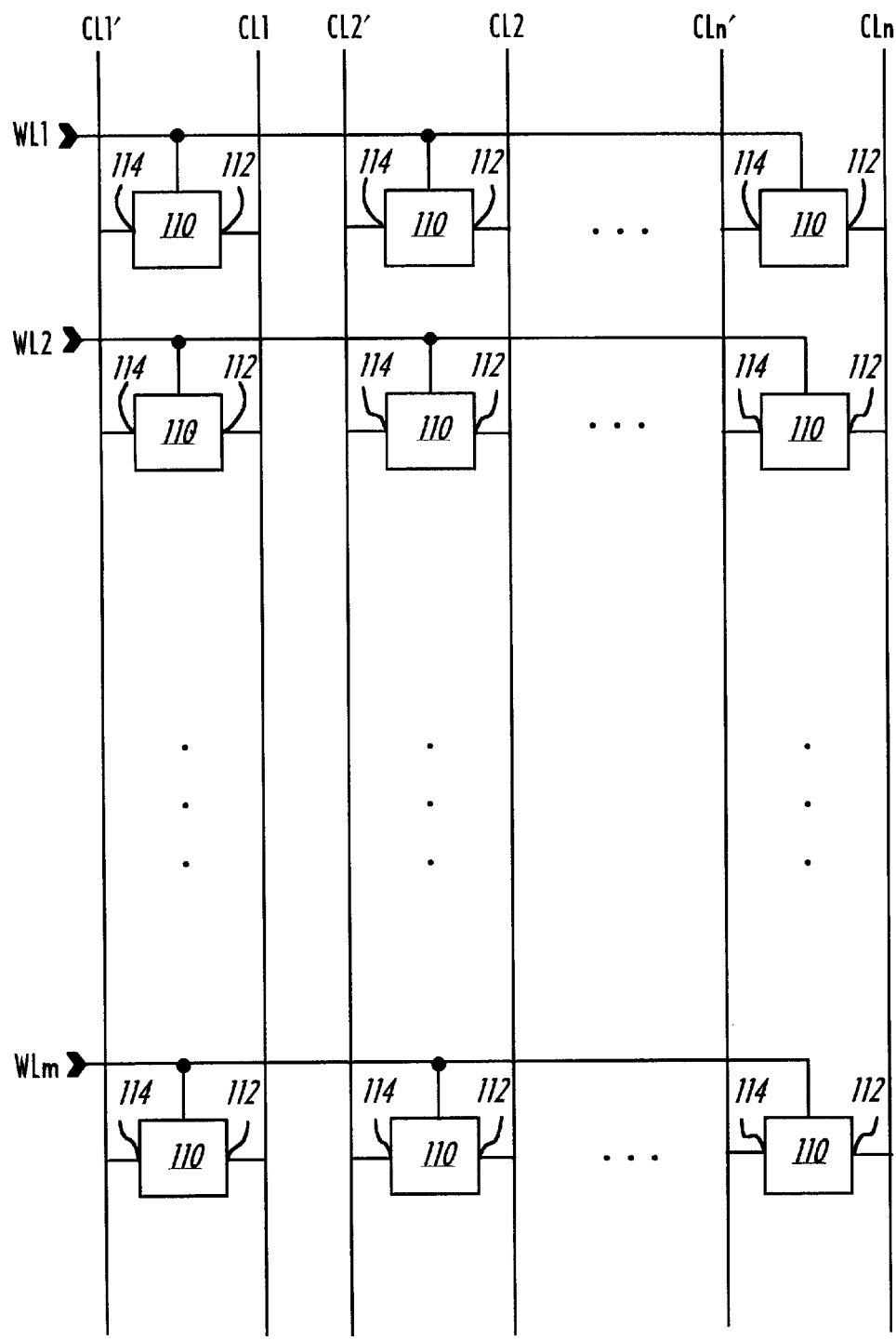
FIG. 1 is a schematic diagram of a prior art SRAM array.
Figure 2:
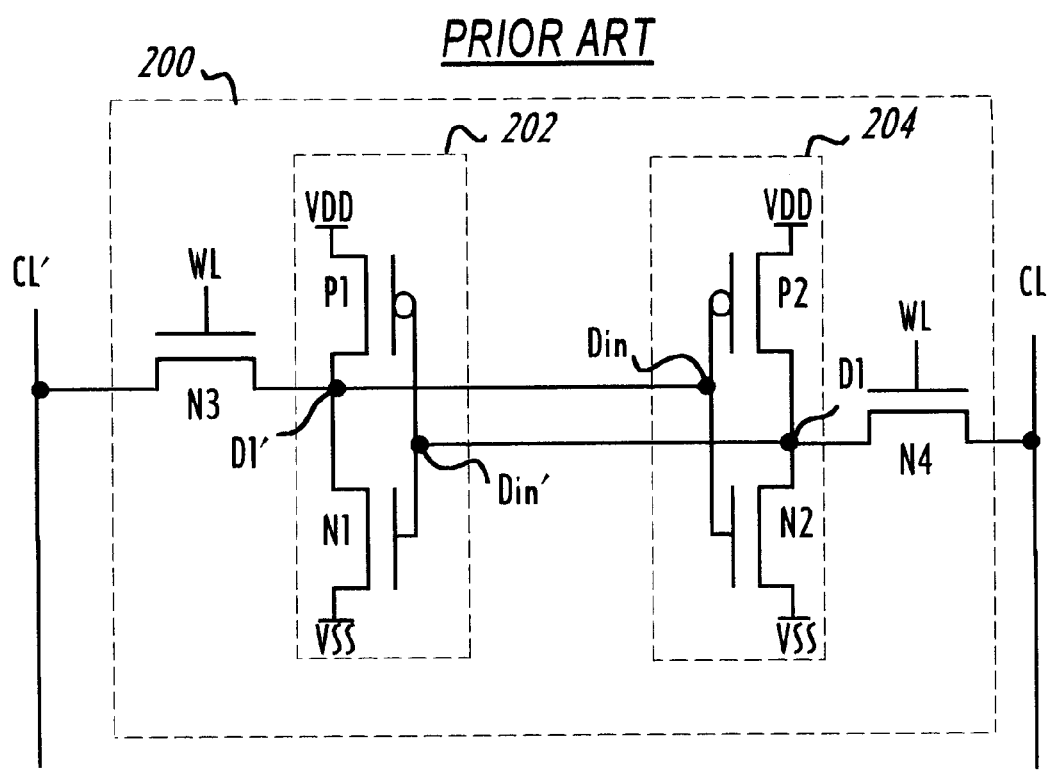
FIG. 2 is a block diagram of a prior art conventional SRAM cell.

The novel features of the present invention will be better understood with reference to the prior art, as illustrated in FIGS. 1 and 2. FIG. 1 is a block diagram of a conventional m-by-n SRAM array 100. Array 100 includes a plurality of storage cells 110 arranged in m rows and n columns. Each storage cell 110 holds a bit value, which is characterized by operation in one of two mutually-exclusive and self-maintaining operating states. Each operating state defines one of the two possible binary bit values, zero or one. The conventional prior art SRAM array 100 is implemented using differential circuit techniques. Each storage cell 110 is provided with a pair of differential input/output (I/O) ports 112, 114, referred respectively herein as a driving I/O port 112 and an inverse I/O port 114, which at any given time maintain voltage levels that are inverse to one another.

Each storage cell 110 lying in the same column shares a common differential bitline pair CL and CL', shown (for columns 0–n) as CL1 and CL1' through CLn and CLn'. Each storage cell 110 is responsive to a wordline signal WL, shown positionally as WL1 and through WLm, to couple its differential input/output ports 112, 114 to its respective column's differential bitline pair CL and CL'. Column select circuitry (not shown) selects the differential bitline pair CL and CL' of the particular cell that is to be read or written. Word select circuitry (not shown) activates the wordline signal WL of the desired storage cell 110. In the simplest embodiment, each bit in a word lies in the same row in the array of cells. In other configurations, each bit in a given word lies in different areas of the SRAM array in order to reduce bit error rates. Reading a particular storage cell involves activating the desired storage cell's wordline signal WL to connect the cell's respective differential I/O ports 112, 114 to its corresponding column lines CL and CL'. Writing to a desired storage cell 110 involves first placing selected complementary logic voltages on the cell's respective column lines CL and CL', and then activating the cell's wordline signal WL to connect those logic voltages to the cell's respective I/O ports 112, 114. This forces the I/O ports 112, 114 to the selected logic voltages, which are maintained as long as power is supplied to the storage cell, or until the storage cell is rewritten.

FIG. 2 shows a conventional six-transistor static read/write storage cell 200 that is typically used to implement the storage cells 110 in high-density static random access memories (SRAMs) 100. Storage cell 200 generally comprises first and second inverters 202 and 204 which are cross-coupled to form a bistable flip-flop. Inverters 202 and 204 are formed by n-channel driver transistors N1 and N2, and p-channel load transistors P1 and P2.

The source regions of driver transistors N1 and N2 are tied to a low reference or circuit supply voltage, labeled VSS, which is typically the circuit ground. Load transistors P1 and P2 are connected in series between a high reference or circuit supply voltage, labeled VDD, and the drains of the corresponding driver transistors N1 and N2. The gates of load transistors P1 and P2 are connected to the gates of the corresponding driver transistors N1 and N2.

Inverter 202 has an inverter output D1' formed by the drain of driver transistor N1 and drain of load transistor P1. Similarly, inverter 204 has inverter output D1 formed by the drain of driver transistor N2 and drain of load transistor P2. Inverter 202 has inverter input Din' formed by the gate of driver transistor N1 and gate of load transistor P1. Inverter 204 has inverter input formed by the gate of driver transistor N2 and gate of load transistor P2.

The inputs and outputs of inverters 202 and 204 are cross-coupled to form a flip-flop having a pair of complementary two-state outputs. Specifically, inverter output D1' is cross-coupled to inverter input Din, and inverter output D1 is cross-coupled to inverter input Din'. In this configuration, inverter outputs D1 and D1' form the complementary two-state outputs of the flip-flop.

A memory flip-flop such as that described typically forms one storage cell of an integrated array of static memory elements such as SRAM array 100 shown in FIG. 1. A plurality of access transistors, such as access transistors N3 and N4, are used to selectively address and access individual storage cells 200 within the array. Access transistor N3 has one active terminal connected to cross-coupled inverter output D1'. Access transistor N4 has one active terminal connected to cross-coupled inverter output D1. A plurality of complementary column line pairs, such as the single pair of complementary column lines CL and CL' shown, are respectively connected to the active terminals respective access transistors N3 and N4 of each storage cell 200 lying in the same column. Wordline signal WL is connected to the gates of access transistors N3 and N4.

Storage cell 200 is read by activating wordline signal WL to connect inverter outputs D1 and D1' to respective column lines CL and CL'. Storage cell 200 is written to by first placing selected complementary logic voltages on column lines CL and CL', and then activating wordline signal WL to connect those logic voltages to inverter outputs D1 and D1'. This forces the outputs D1 and D1' to the selected logic voltages, which are maintained as long as power is supplied to the cell 200, or until storage cell 200 is rewritten.

Storage cell 200 is said to be bistable because it has two stable or self-maintaining operating states, corresponding to two different output voltages. Without external stimuli, storage cell 200 will operate continuously in a single one of its two operating states. It has internal feedback to maintain a stable output voltage, corresponding to the operating state of the storage cell 200, as long as it continues to receive power. The two possible output voltages produced by storage cell 200 correspond generally to upper and lower circuit supply voltages, VDD and VSS. Intermediate output voltages, between the upper and lower circuit supply voltages VDD and VSS, generally do not occur except for during brief periods of storage cell 200 power-up and during transitions from one operating state to the other operating state.

The conventional SRAM design employs differential circuit techniques in order to provide higher noise immunity and cell stability than a single-ended cell design. In a single-ended storage cell design, a cell is read or written via a single column line and a single access transistor. However, the single-ended storage cell design is problematic. If a given storage cell is accessed only from I/O port, e.g., D1 in cell 200, via a single access transistor, e.g., N4, a read operation of the cell 200 when the cell is storing a logic low level (i.e., a "0"), exposes the stored value to instability. Because bitline CL is precharged high, when access transistor N4 is turned on during a read operation, charge accumulates on I/O port D1, which may cause inverter 202 to flip, and therefore cause inverter 204 to flip, and thereby flipping the stored value of cell 200 from a logic low level (i.e., a "0") to a logic high level (i.e., a "1"). To avoid this undesirable effect, two things are typically done. First, the sizes of NFETs N2 and N4 are designed such that the charge accumulated on I/O port (i.e., D1) during a read operation is insufficient to cause inverter 202 to flip. Meeting this condition makes it impossible to write a logic high level (i.e., a "1"). Second, the input to inverter 204 is simultaneously coupled to a differential bitline CL', which is also precharged high. During a read operation, this helps maintain I/O port D1 at a logic high level (i.e., a "1") in order to prevent inverter 204 from flipping. During a write operation of a logic high level (i.e., a "1") on D1, differential bitline CL' is driven to a logic low level (i.e., a "0") to simultaneously couple I/O port D1' to a logic low level.

The benefits provided by the differential storage cell design comes at the cost of two column lines CL and CL' per column and therefore two access transistors N3 and N4 per storage cell. In an SRAM array comprising millions of storage cells, this space cost becomes increasingly significant, and a method for implementing a single-ended storage cell design becomes increasingly desirable.

Figure 3:
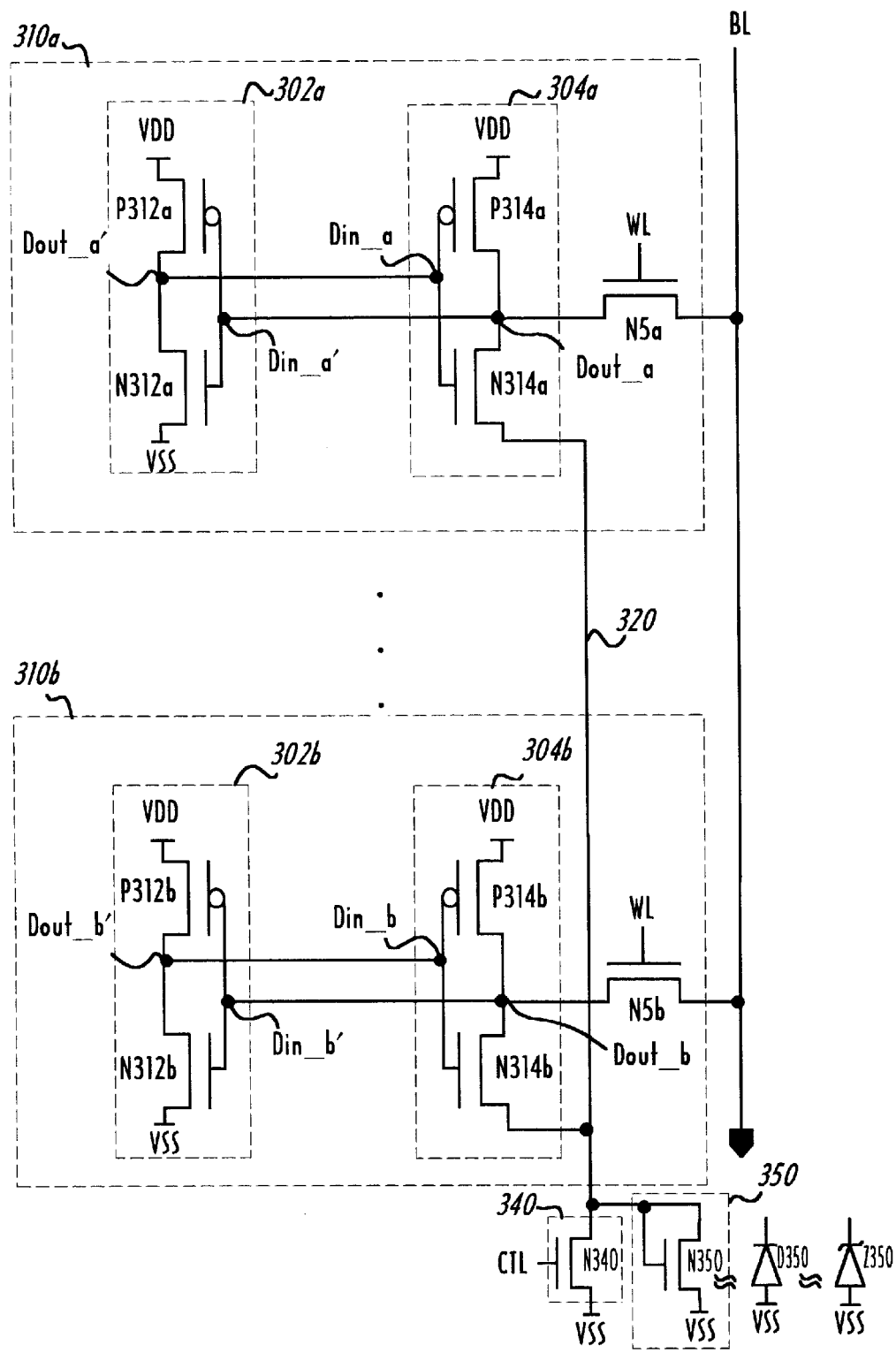
FIG. 3 is a schematic diagram of a storage cell design in accordance with the invention.

FIG. 3 is a schematic diagram of a column 300 in an SRAM memory illustrating the single-ended storage cell design in accordance with the invention. FIG. 3 illustrates a column identical storage cells 310, shown respectively as 310a and 310b, which share a common single column line, hereinafter "bitline", BL. Each storage cell 310a includes n-channel driver transistor N312a and p-channel load transistor P312a arranged to form inverter 302a, and n-channel driver transistor N314a and p-channel load transistor P314a arranged to form inverter 304a.

Inverter 302 has inverter input $Din_{in\_a}'$ formed by the gates of driver transistor N312a and load transistor P312a. Inverter 302a has an inverter output $D_{out\_a}'$ formed by the drains of driver transistor N312a and load transistor P312a. Inverter 304 has inverter input $D_{in\_a}$ a formed by the gates of driver transistor N314a and load transistor P314a. Inverter 304 has inverter output $D_{out\_a}$ aformed by the drains of driver transistor N314a and load transistor P314a.

The inputs and outputs of inverters 302a and 304a are cross-coupled to form a bistable flip-flop. Inverter output $D_{out\_a}$ forms the single two-state output of cell 310a.

Storage cell 310b is configured identically to storage cell 310a, and is shown in FIG. 3 with identical reference numbers using identifying subscript b.

The source regions of driver transistors N314a and N314b are each tied to a virtual ground line 320, which is switchably coupled, via an isolation mechanism 340, to low reference voltage VSS, typically the circuit ground.

The single-ended storage cell design of cells 310a and 310b eliminates one column line CL' and one access transistor N3 of the prior art cell 200, resulting in a reduction by half of the required number of column lines (i.e., bitlines) and a reduction by one-sixth of the minimum number of transistors per storage cell. Over a large SRAM array, this amounts to significant space reduction.

As described previously, a single-ended storage cell design incurs stability problems during read operations. This problem is overcome by designing access transistor N5a, N5b to be weaker than driver transistor N314a, N314b. Thus, during a read of a cell 310a, 310b that is storing a logic low level, it is much more difficult for access transistor N5a, N5b, which couples the pre-charged logic high level on line BL to I/O port Dout_a, Dout_b, to override driver transistor N314a, N314b and thus results in higher cell stability. However, in writing a logic high level (i.e., a "1") to the same cell, where it is desired to store the logic high level from pre-charged bitline BL onto I/O port Dout_a, Dout_b, the use of a relatively weaker access transistor N5a, N5b and a relatively stronger driver transistor N314a, N314b is problematic precisely because the transistor sizing works against writing a "1" to the cell. That is, access transistor N5a, N5b is too weak to override the stronger driver transistor N314a, N314b. Furthermore, for added stability during read operations, the driver transistor N312a, N312b is sized to be relatively stronger than load transistor P312a, P312b in order to set the trigger point of inverter 302a, 302b to favor the storage of a "0" in cell 310a, 310b, thus adding to the load that weaker access transistor N5a, N5b must overcome when writing a "1" to the cell 310a, 310b.

Accordingly, due to the competing issues of providing cell stability during the read of a "0" and the need to be able to write a "1" to the cell fast enough to meet the ever-demanding speed requirements, a mechanism is provided to weaken the driver transistor N314a, N314b of inverter 304a, 304b when a "1" is being written to cell 310a, 310b. This mechanism is formed by virtual ground line 320 and isolation mechanism 340.

Isolation mechanism 340 is responsive to a control signal CTL to couple virtual ground line 340 to low reference voltage source VSS only when a "1" is not being written to one of the cells 310a–310b that are coupled to bitline BL. In the preferred embodiment, isolation mechanism 340 is implemented with an NFET 340. NFET 340 is coupled drain-to-source between virtual ground line 320 and low reference voltage VSS. The gate of NFET 340 is controlled by control signal CTL.

Thus, during read operations and during writing of a "zero" to one of the cells 310a–310b coupled to bitline BL, NFET N340 is turned on and line 320 is pulled low by a direct path to ground. When writing a "zero" to any of cells 310a–310b that are coupled to bitline BL, NFET N340 is turned off. Accordingly, the source region of driver transistor N314a no longer has a direct path to ground, and I/O port $D_{out\_a}$ may be more quickly pulled high by the high reference voltage on bitline BL.

The virtual ground mechanism operates to successfully weaken driver transistor N314a or N314b during the write of a "1" to cell 310a or 310b, respectively. However, the write of "1" to a given cell 310a or 310b in a column 300 (e.g., storage cell 310a) can cause the drain of isolation mechanism NFET N340 to reach a high enough level that it undesirably flips inverter 304b of cell 310b in the same column. Accordingly, the present invention provides a mechanism to prevent storage cell instability when writing a "1" to one of several commonly coupled single-ended storage cells 310a, 310b. This function is provided by a clamping device 350, shown in detail in FIG. 3 as transistor NFET N350. The function and purpose of the clamping device 350 is to clamp the voltage on virtual ground line 320 so that it does not go above the threshold voltage of isolation mechanism 340. In the preferred embodiment, clamping device 350 is implemented using an NFET N350 whose gate and drain are coupled to virtual ground line 320, and whose source is coupled to low reference voltage VSS. This configuration ensures that virtual ground line 320 never exceeds the threshold voltage of isolation mechanism 340, and therefore, during a write of a "1" to one storage cell 310a in a given column 300, prevents any of the other commonly connected storage cells 310b from undesirably flipping its stored value. Clamping device 350 may alternatively be implemented using any mechanism that requires any number of steps to perform the clamping function of NFET N350, such as a diode D350, or a zener diode Z350 implemented during the fabrication process.

It will be appreciated from the above description that the present invention provides several unique advantages over the prior art. Among the advantages, it allows the use of a single-ended five-transistor storage cell in order to reduce the number of access transistors and number of column lines over the entire SRAM array. An additional advantage is that the design is robust in that it compensates for the competing design goals between pre-charged read operations and writing a "one" during write operations. A further advantage is that because of the robust design, the switching points of the two inverters in the cell may be individually adjusted to provide a high cell noise margin.

The invention has been shown and described in terms of a single preferred embodiment. It will be appreciated by those skilled in the art that various modifications may be made without departing from the spirit and scope of the invention. It is intended that the invention be limited only by the claims appended hereto.

What is claimed is:

1. A storage memory, comprising:
   a virtual ground line switchably couplable to a low reference voltage;
   a bitline;
   a high reference voltage terminal;
   a plurality of storage cells, each comprising:
   a single input/output (I/O) port;
   switching means coupled to said bitline and said I/O port, said switching means responsive to a select signal for coupling said input/output port to said bitline;
   a first CMOS inverter, coupled between said high reference voltage terminal and said virtual ground line, said first CMOS inverter having a first inverter input and a first inverter output, said first inverter output being coupled to said I/O port; and
   a second CMOS inverter having a second inverter input coupled to said first inverter output and a second inverter output coupled to said first inverter input;
   an isolation mechanism connected between said virtual ground line and said low reference voltage, said isolation mechanism coupling said virtual ground line to said low reference voltage during a write of a low reference voltage and during a read of any of said plurality of storage cells, and said isolation mechanism isolating said virtual ground line from said low reference voltage during a write of a high reference voltage to any of said plurality of storage cells; and a clamping device connected between said virtual ground line and said low reference voltage operative to prevent said virtual ground line from exceeding a threshold voltage of said isolation mechanism during said write of said high reference voltage to any of said plurality of storage cells.

2. The storage memory in accordance with claim 1, wherein:

said clamping device comprises an NFET, said NFET having a drain and gate coupled to said virtual ground line and a source coupled to said low reference voltage.

3. The storage memory in accordance with claim 1, wherein:

said clamping device comprises a diode, said diode having an output coupled to said virtual ground line and an input coupled to said low reference voltage.

4. The storage memory in accordance with claim 1, wherein:

said clamping device comprises a zener diode, said diode having an output coupled to said virtual ground line and an input coupled to said low reference voltage.

5. The storage memory in accordance with claim 1 wherein:

said isolation mechanism comprises an NFET having a drain coupled to said virtual ground line, a source coupled to said low reference voltage, and a gate coupled to receive a control signal, said control signal activating said NFET to couple said virtual ground line to said low reference voltage during any read, and a write of a low reference voltage, of any of said plurality of storage cells, and disabling said NFET to isolate said virtual ground line from said low reference voltage during a write of a high reference voltage to any of said plurality of storage cells.

6. The storage memory in accordance with claim 1, wherein:

said first CMOS inverter comprises:
a first FET coupled drain-to-source between said high reference voltage said first inverter output; and
a second FET coupled drain-to-source between said first inverter output and said virtual ground line;

wherein said first inverter input is coupled to gates of each of said first FET and said second FET; and said second CMOS inverter comprises:
a third FET coupled drain-to-source between said high reference voltage said second inverter output; and
a fourth FET coupled drain-to-source between said second inverter output and said low reference voltage;
wherein said second inverter input is coupled to gates of each of said third FET and said fourth FET;

wherein said first inverter output is coupled to said second inverter input and said second inverter output is coupled to said first inverter input.

7. The storage memory in accordance with claim 1, wherein:

said switching means comprises a FET coupled drain-to-source between said I/O port and said bitline, and having a gate coupled to said select signal.

8. In a static random access memory (SRAM) array comprising a plurality of storage cells, each storage cell being a member of a like column and comprising an input/output (I/O) port switchably coupled to a common bitline, a first inverter comprising a first NFET and a first PFET coupled in drain-to-drain relationship between a high reference voltage and a virtual ground line, said virtual ground line being switchably coupled to a low reference voltage, and a second inverter coupled to said first inverter to form a bistable flip-flop, a method for weakening said first NFET of said first inverter during a write of said high reference voltage to said storage cell, said method comprising the steps of:

clamping said virtual ground line to prevent said virtual ground line from exceeding a threshold voltage of said isolation mechanism during a write of said high reference voltage to any of said plurality of storage cells;

coupling said virtual ground line to said low reference voltage during a write of a low reference voltage, or during a read, of any of said plurality of storage cells;

isolating said virtual ground line from said low reference voltage during a write of said high reference voltage to any of said plurality of storage cells.

* * * * *